United States Patent [19]
Taoka et al.

[11] Patent Number: 5,317,525
[45] Date of Patent: May 31, 1994

[54] ELECTRIC POWER SYSTEM SIMULATOR

[75] Inventors: Hisao Taoka, Amagasaki; Isao Iyoda, Tokyo; Hideo Noguchi, Kobe; Yukio Kojima, Chofu; Shigeru Warashina, Chofu; Nobuyuki Sato, Chogu, all of Japan

[73] Assignees: Mitsubishi Denki Kabushiki Kaisha; The Tokyo Electric Power Co., Inc., Tokyo, Japan

[21] Appl. No.: 665,192

[22] Filed: Mar. 5, 1991

[30] Foreign Application Priority Data

| Mar. 6, 1990 | [JP] | Japan | 2-55621 |
| Mar. 6, 1990 | [JP] | Japan | 2-55622 |
| Mar. 6, 1990 | [JP] | Japan | 2-55623 |
| Mar. 6, 1990 | [JP] | Japan | 2-55624 |
| Mar. 6, 1990 | [JP] | Japan | 2-55625 |
| Mar. 6, 1990 | [JP] | Japan | 2-55626 |

[51] Int. Cl.$^5$ ............................................. G06F 15/60
[52] U.S. Cl. ...................................... 364/578; 364/801
[58] Field of Search ................ 364/578, 495, 801, 802

[56] References Cited

U.S. PATENT DOCUMENTS

| 3,551,893 | 12/1970 | Mehneri et al. | 364/578 |
| 3,808,409 | 4/1974 | Enns et al. | 364/578 |
| 3,825,732 | 7/1974 | Haley et al. | 364/578 |
| 3,833,927 | 9/1974 | Carlson et al. | 364/578 |
| 3,883,724 | 5/1975 | Pradhan et al. | 364/802 |
| 3,976,868 | 8/1976 | Lang | 364/802 |
| 4,985,860 | 1/1991 | Vlach | 364/578 |

FOREIGN PATENT DOCUMENTS

| 50-161651 | 12/1975 | Japan . |
| 1245493 | of 1989 | Japan . |
| 227886 | 6/1990 | Japan . |
| 4363300 | 2/1975 | U.S.S.R. | 364/495 |

OTHER PUBLICATIONS

Corless et al.; "An Experimental Electronic Power-System Simulator"; IEEE, Oct. 1958.
Chadha et al.; "A multi-level mixed-mode simulator"; IEEE; 1988.
Akimoto et al.; "Distributed Power System Simulation on a Hypercube Computer"; IFAC Sep. 26, 1989.
*Graph Theory Circuit*, Publ. Shokodo, pp. 109-115 (1974).
Kansai Electric Power Co. catalog, "APSA" (undated).
Article No. 59-B36, *Trans. IEE of Japan*, vol. 104-B. No. 5, pp. 297-304 (May, 1984).
Sekine, *Analytical Theory of Electric Power System*, Publ. Denki-Shoin, pp. 294-299 (1971).

Primary Examiner—Jack B. Harvey
Assistant Examiner—Ellis B. Ramirez
Attorney, Agent, or Firm—Rothwell, Figg, Ernst & Kurz

[57] ABSTRACT

An electric power system simulator comprising first calculator which calculates a generator dynamic characteristic, second calculator which calculates a load dynamic characteristic and third calculator which calculates power transmission condition of an electric power system network, then the first calculator cyclically obtains an amplitude and a phase of an internal induced voltage of the generator based on data on an output power and a terminal voltage of the generator, and the second calculator calculates a load equivalent admittance at predetermined time based on data on an A.C. voltage at a load installation point, and the third calculator calculates a current flowing in each element of the electric power system based on respective data obtained by the first calculator and the second calculator and an electric power system network impedance to obtain the output power and terminal voltage of the generator, so that a condition change of the electric power system including the generators is serially simulated by alternately executing the calculations of the first and the second calculators and the calculation of the third calculator.

7 Claims, 15 Drawing Sheets

ELECTRIC POWER SYSTEM SIMULATOR

BACKGROUND OF THE INVENTION

1. Field of the Invention

This invention relates to a simulator which simulates, in real time, dynamic phenomena of a large scale electric power system, thereby analyzing them and further performing a function test of each element of the electric power system.

2. Description of Related Art

Heretofore two types of simulators are well-known which simulate an electric power system. One is an analog type which combines many of apparatuses each of which simulates each element of the electric power system, for example, such as shown in Kansai Electric Power Co's catalog "Advanced Power System Analyzer APSA", and the other is a digital type which analyzes each element by a large general-purpose computer by using a calculation equation.

However, the conventional analog type simulator can not simulate the real large scale electric power system and further a change of condition of the electric power system to be simulated is practically impossible because it requires enormous work loads. Explaining more concretely, the analog type simulator simulates the electric power system with a miniature model which is really provided with the electric power system elements such as generators, AVRs (Automatic Voltage Regulators), power generation control apparatuses like governors, transformers, loads, SVCs (Static Var Compensator), and transmission lines, thus as a scale of the electric power system to be simulated becomes larger, the miniature model occupies a larger space. For example, in order to simulate an electric power system including thirty generators, the above APSA occupies as large area as 700 m² for only a simulator, thus there is a limit to an occupancy area for simulation of the large scale electric power system. Further, when changing wirings of the electric power system to be simulated, it is required to change connections of the simulator and this necessitates troublesome and a large quantity of work loads.

While the conventional digital type simulator has a few CPUs, in order to analyze differential equations for simulating elements such as a generator, excitation system, PSS (Power System Stabilizer), and governing system, the simulator employs either a batch solution which solves an equation expressing the whole system or a partition solution which solves serially each equation representing each element ("High Speed Transient Stability Calculation Method suitable for Array Processor", Institution of Electrical Engineers of Japan, treatises separate volume B, article No. 59-B36, pp297–304, May 1984).

However both the solutions consume much processing time because the batch solution is required to solve a large equation at one stroke, while the partition solution is required to stop all other processing to solve one equation during its solving, thus both the solutions can not cope with the simulation, in real time, of the real electric power system. Further, the digital type simulator calculates the differential equation to express the element of the electric power system as the case of the analog type simulator as mentioned above, but it is expected that because of necessary focusing calculation, an analysis of a high speed phenomenon is difficult to effect even with the decentralized computer, and further an error when modeling a real phenomenon in an equation can not be avoided.

Now, the simulation of an electric power system is a task of solving alternately two sets of equations in time series, that is, a differential equation that calculates dynamics of each element configuring the system such as a generator, excitation system, PSS, governing system and a rotating motion system, and a network equation that expresses a relation between a bus and a transmission line.

FIG. 1 is a flowchart showing whole of calculation processes of the electric power system simulator shown in the above "High Speed Transient Stability Calculating Method suitable for Array Processor".

Step S41 is a process of initialization, Step S21 to Step S23 are processes of electric power system network calculation, Step S101 to Step S105 are processes for generator dynamic characteristic calculation and Step S45 and Step S46 are processes proper to this technique.

Procedure of this flowchart is as follows.

First, after initialization in Step S41, calculation relating to a generator bus (Step S21) and calculation relating to a non-generator bus (Step S22) are executed respectively. In this flowchart, the electric power system network calculation is performed considering a so-called constant power characteristic of consuming a constant power rather than a non-linear characteristic of a load, for example, an applied voltage, thus a solution is obtained by repeated calculations as shown in Step S21 to Step S23. That is, focusing or non-focusing is decided in Step S23, and in the case of non-focusing, the process is returned to Step S21.

When focusing is decided in Step S23, a generator output power and terminal voltage are obtained. According to decisions in Step S45 and Step S46, when focusing for the second time or more, the process ends, and in other case (focusing for the first time), a generator dynamic characteristic is calculated using information on generator output power and terminal voltage in Step S101 to Step S105. That is, calculation of a rotating motion system (Step S101), calculation of PSS (Step S102), calculation of a excitation system (Step S103), calculation of a governing system (Step S104), and calculation of a generator equation (Step S105) are respectively performed. Using data of an amplitude and a phase of a generator internal induced voltage obtained from these calculations, the process is returned to Step S21 to perform again the electric power system network calculation.

In addition, in the flowchart of FIG. 1, the processes from "START" to "END" are performed in one time step of integration, and by cyclically repeating the process of every one time step of integration, a change of condition of the electric power system is serially calculated.

Now, in the calculation of the rotating motion system in Step S101, a generator rotor position $\theta$ is calculated by introducing a phase $\delta$ as a variable which meets an equation $$\theta = \omega_0 t + \delta$$

as shown, for example, in "Analytical Theory of Electric Power System" (pp 294–299, written by Sekine, published by Denki-Shoin in 1971), where $\omega_0$ is a rated angular velocity in an A.C. system. In a usual A.C. system, all generators are rotating at an almost rated angular velocity, thus it is known that the phase δ remains within the range of −360 n° to +360 n° and there is no problem. However, when one generator causes, for example, step-out to increase a rotational speed or when the generator is in stopped condition, the phase δ rapidly increases or decreases. In this case, there arises no problem in pure theory, but a problem arises in a digital numerical calculation.

In a computer system, a numerical value is generally expressed with "$A * 10^B$", whereby the system usually handles numbers each of which combining a mantissa A and an exponent B. But hexadecimal numbers are actually used in the computer system, however, for simplification, the numerical calculation will be explained with decimal numbers.

For example, in the computer system handling a mantissa A of four digits and an exponent B of two digits, a decimal number "58325" is expressed as $5833*10^1$ and this is handled as a number "583301". Therefore, either the case where the phase δ is equal to "58325" or equal to "58333", both the numbers are handled as "583301" in the computer system. Thus, the difference between both the numbers is to be "8" in pure theory, but becomes "0" in the computer system. Therefore, when step-out or stop of a generator lasts long, the conventional digital type electric power system simulator sometimes handles data beyond the range of significant figures of the computer system as mentioned above and below comes unable to perform precise calculations and can not simulate the system.

As mentioned above, when simulation of condition of long-lasted generator step-out, simulation of a system including a stopped generator or simulation of a system including two different frequencies A.C. systems connected with a D.C. transmission system are performed by the conventional digital type electric power system simulator, the value of the phase δ becomes unusually large and falls within the range of a numerical calculation error of the computer system and this sometimes disables the computer system from calculation, that is, the simulation.

Further, in the conventional electric power system simulator, as shown in the flowchart of FIG. 1, repeated calculations are employed for the electric power system network calculation, thus extending an operation time, and a number of times of repetition until focusing differs depending on other condition, thereby causing a problem of an inconstant operation time. Therefore, it was difficult to perform, for example, the so-called real time simulation which advances calculation in a constant time interval. Further, in the so-called threshold running like the case of a voltage instability state, there are problems such that focusing ability is degraded to increase the number of times of calculation repetition and sometimes the case of non-focusing arises.

Further, in the conventional electric power system simulator performing the procedure of the flowchart of FIG. 1, all processings are executed by one calculating unit, thus time management, that is, processings in each predetermined time interval are relatively easily performed, but a time necessary for calculation is extended. As processings of Step S101 to Step S105 are required to be particularly performed on each generator, as a number of generators increases, a time of processings of Step S101 to Step S105 is more extended. In addition, there are problems such that, as the number of generators increases, the time management becomes more difficult and the real time simulation is disabled.

Now, as an application example of the aforementioned decentralized type computer, the invention disclosed in Japanese Patent Application No. 1-245493 (1989) is proposed as a digital type simulator capable of high speed processing.

In the invention disclosed in the Japanese Patent Application No. 1-245493 (1989), a decentralized type computer having a plurality of CPUs 61 is used as shown in FIG. 2 and a different equation expressing each element of the electric power system such as a generator, excitation system, PSS or a governing system is assigned to each one of the plurality of CPUs 61. Then each calculation processings divided into each element are decentralized-processed by each CPU 61, thereby the load of each CPU is alleviated, thus the calculations can be processed at a high speed as a whole.

By the way reference numeral 62 denotes a communication line connecting the space between respective CPUs 61.

FIG. 3 is a flowchart showing procedures relating to one bus which is one of the elements of the electric power system in the simulator of the invention disclosed in the above Japanese Patent Application No. 1-245493 (1989). By the way the bus includes a generator bus which is directly connected to the generator and a non-generator bus which is not directly connected to the generator.

As shown in FIG. 3, in a task of obtaining a solution of the different equation performed by each CPU 61, a task of calculation relating to electric systems of each generator bus 31 (PSS 33, excitation system 34, generator 35) and a task of calculation relating to mechanical systems of each generator bus 31 (rotating motion system 36, governing system 37) can be parallel-executed. However the task of calculation relating to each element of the electric system and that of the mechanical system are performed by CPUs 61 independently, thus data interchange is necessary between both the tasks. By the way processing on the non-generator bus 32 does not requires communication with a calculation task of dynamics of the generator bus 31.

In this way, a network equation 38 representative of a relation between the buses is calculated using results of the decentralized-processings of respective CPUs 61 and transferring data 39 between the buses until focusing at each CPU 61.

Now, in the conventional simulator using the above decentralized type computer, each different equation expressing each element of the electric power system is assigned to each CPU 61, whereby respective calculations on each element of the electric power system are decentralized to reduce a processing time. However, on the other hand, generally a solution of the network equation is obtained by solving system condition expressed by a linear equation with the LU analysis method or Newton-Raphson method. For example, generally regarding a generator and a load as equivalent current sources and expressing the system condition with the following linear equation system, $$I = YV$$

where
I: current
Y: admittance
V: voltage then the system condition is solved with the LU analysis method regarding the current I as a known quantity and the voltage V as an unknown quantity.

Besides other some algorithms are being considered which solve the equation with the decentralized type computer, but it is not right to say that high speed analysis capability of the decentralized system is best used even when any method is used.

In addition, the conventional digital type simulator has a problem in man-machine device. For example, the simulator can not output an intermediate result of an analysis calculation of the electric power system and has only a function of outputting the analysis result in a format of a table or graph only after the end of the calculation. This originates directly from logic unable to stop the analysis calculation or to intermediately output the calculation result, but besides that it is supposed that because of a low speed of the analysis calculation, an operator could not feel a real time sense and he did not also sense necessity of the man-machine device except output of the analysis result.

SUMMARY OF THE INVENTION

This invention was attained in view of the above problems belonging to the conventional electric power system simulator.

The first object of the present invention is to provide an electric power system simulator which can eliminate the problems originated from repeated calculations for the system network analysis and can cope with the real time simulation.

The second object of the invention is to provide an electric power system simulator which can perform calculation for the system network analysis in a short time, and can execute the real time simulation by performing relatively correct time management for the calculation even when a number of generators in the electric power system to be simulated is increased.

The third object of the invention is to provide an electric power system simulator which prevents a generator phase from exceeding a predetermined value and also prevent the phase value from falling within the range of a numerical calculation error when the generator causes step-out, whereby the simulator can cope with simulation of condition lasting long after the generator step-out, simulation of a system including a stopped generator or simulation of a system having two different frequencies A.C. systems connected with a D.C. transmission system.

The fourth object of the invention is to provide a real time electric power system simulator which can quickly process focusing calculation in the electric power system simulator using a decentralized type computer and can simulate a phenomenon of a large scale electric power system at a speed near the real phenomenon proceeding speed.

The fifth object of the invention is to provide an electric power system simulator which can simulate phenomena of a large scale electric power system with easy setting and can easily changing the electric power system and further can analyze phenomena of real machines and apparatuses which are difficult to analyze by a computer by making the best use of each advantage of an analog type simulator and a digital type real time simulator.

The sixth object of the invention is to provide an electric power system simulator which can output not only a final result but also intermediate condition in real time and further comprises a man-machine device which is able to change condition.

The first invention comprises first calculating means which calculates a generator dynamic characteristic, second calculating means which calculates a load dynamic characteristic and third calculating means which calculates power transmission condition of an electric power system network. The first calculating means receives data on a generator output and a terminal voltage to obtain an amplitude and a phase of the internal induced voltage of the generator after every one time step of integration, and the second calculating means receives data on an A.C. voltage at a load installation point to calculate a load equivalent admittance after every one time step of integration, and the third calculating means receives each data obtained by the first calculating means and the second calculating means, and an electric power system network impedance to calculate an A.C. current flowing in each element of the electric power system by an algorithm for the system network calculation to obtain output of the generator and terminal voltage, and then a condition change of the whole electric power system including generators is serially simulated by alternately performing the calculations executed by the first and the second calculating means and the calculation executed by the third calculating means.

In the first invention mentioned above, a non-linear characteristic of the load is considered in the dynamic characteristic of the load, and in the case of the electric power system calculation, the network calculation is performed using an amplitude and a phase of the internal induced voltage of the generator, a load admittance and an impedance of the power transmission system, whereby the induced voltage is processed as an independent voltage source and a known quantity, thus voltage and current values at any point are obtained from the network calculation, that is, a combination of matrix calculations, therefore the conventional repeated calculations become unnecessary, as a result a quantity of calculation becomes constant and this enables the real-time simulation.

The second invention comprises first calculating means which calculates a generator dynamic characteristic, second calculating means which calculates power transmission condition of an electric power system and communicating means which transfers information between the first and the second calculating means. Then the first calculating means receives data on an output power and a terminal voltage of a generator to calculate data on an internal induced voltage of the generator after every one time step of integration to output the data to the second calculating means via the communicating means, and the second calculating means receives the data outputted from the first calculating means and the various constants of the electric power system network to calculate power transmission condition of the electric power system network at a predetermined time and outputs data on the output and a terminal voltage of the generator to the first calculating means via the communicating means, and then a dynamic change of the electric power system including generators is serially simulated by performing alternately calculation processings by the first and the second calculating means. By the way the first calculating means includes a calculating unit which calculates the power transmission condition of the electric power system network and a time management unit which directs the calculating unit to start at every one time step of integration.

In the second invention mentioned above, when a number of generators in the electric power system to be simulated is increased and thus a quantity of calculation is increased, a new calculating unit is added to take on calculation on one or a plurality of generators, whereby extending of an operation time can be avoided. Further, in the second invention, time management of start of calculation is performed at every one time step of integration, thus the time management for the simulator becomes possible, as a result the real-time simulator is realized.

The third invention comprises first calculating means which calculates a generator dynamic characteristic and second calculating means which calculates power transmission condition of the electric power system network. Then the first calculating means receives data on an output power and a terminal voltage of the generator outputted from the second calculating means to calculate an amplitude and a phase of an internal induced voltage of the generator after every one time step of integration to output these data to the second calculating means. The second calculating means receives the amplitude and phase of the internal induced voltage of the generator outputted from the first calculating means and various constants of the electric power system network to calculate power transmission condition of the electric power system network at a predetermined time to output data on the output power and a terminal voltage of the generator to the first calculating means. Further when a phase of the first calculating means exceeds a predetermined set value obtained by multiplying 360° by an integer, a value subtracted from this phase value by the predetermined value is determined as the phase, and then a dynamic change of the electric power system including generators is serially simulated by performing alternately calculation processings by the first calculating means and the second calculating means.

In the third invention mentioned above, after the phase $\delta$ of the internal induced voltage of the generator was calculated as usual, a check is made to know whether the phase value exceeds the predetermined set value or not, and when exceeds, the phase $\delta$ is so controlled that it remains within the range of the set values by adding or subtracting the set value to or from the phase $\delta$, as a result troubles with calculation do not occur in the computes system.

In the fourth invention, when simulating an electric power system with a decentralized type computer, a simulator performs a network calculation of one bus only on the basis of information of buses directly connected to the bus. Thereby the network calculation focuses fast, thus the analysis in real time becomes possible.

In the fifth invention, an analog type electric power system simulator and a real-time digital type electric power system simulator are connected with an A/D-D/A converter to transfer data between both the simulators, whereby large scale real-time simulation can be performed by making the best use of advantages of both the analog type electric power system simulator and the real-time digital type electric power system simulator.

In the sixth invention, an electric power system simulator of the present invention which can process calculations of a phenomenon of the electric power system at a speed near the proceeding speed of the real phenomenon and outputs electric power system condition every one time step of integration during processing and comprises a man-machine device which can display the output data and perform interruption of a condition change at any time. Whereby the electric power system condition is displayed on the man-machine device in real time in a sense near feeling of the real phenomenon of the electric power system, and further time management of operation time becomes possible, as a result data display and processing are performed as if real troubleshooting were executed.

The above and further objects and features of the invention will more fully be apparent from the following detailed description with accompanying drawings.

DESCRIPTION OF THE PREFERRED EMBODIMENTS

Figure 1:
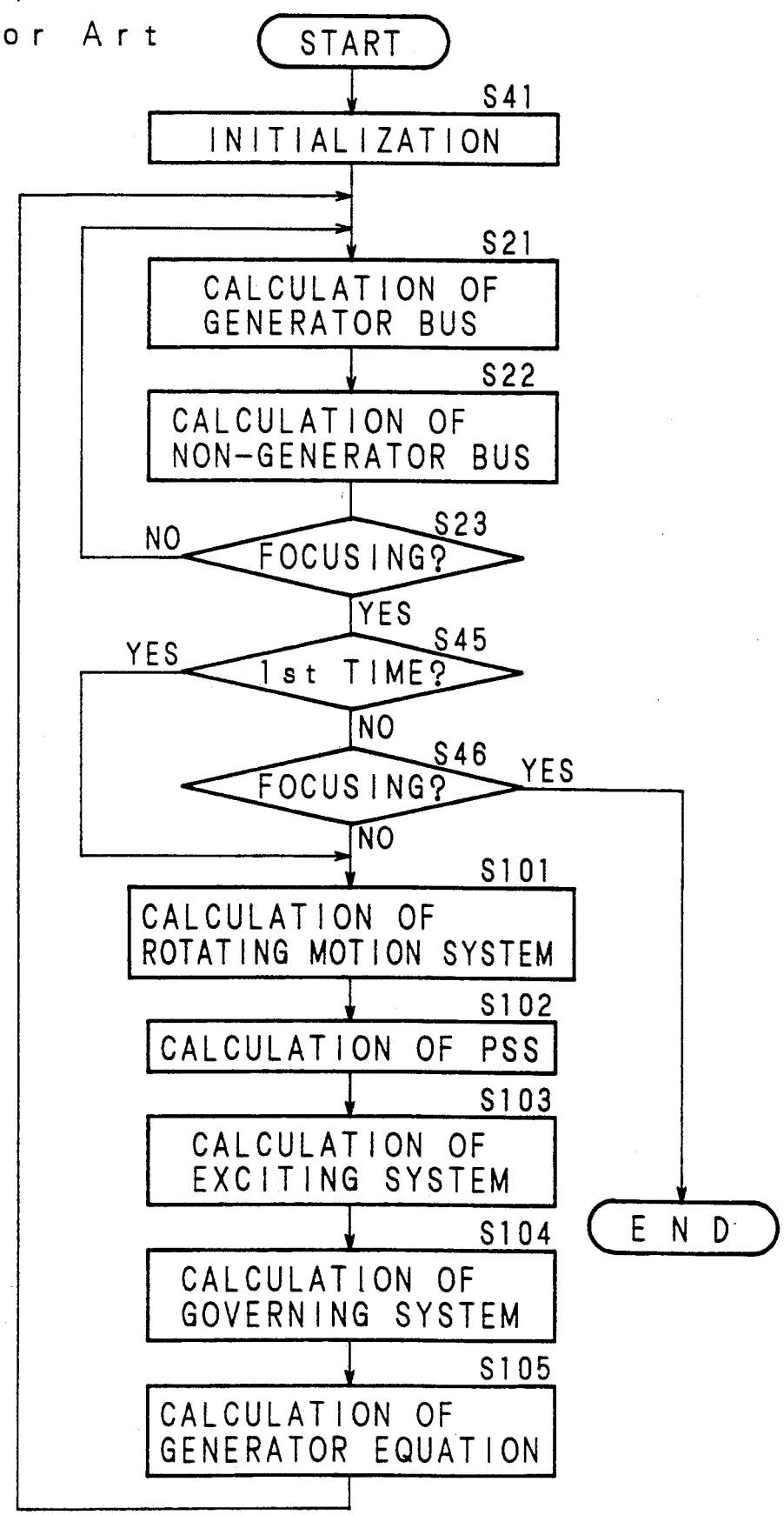
FIG. 1 is a flowchart showing the whole of processing steps of the conventional electric power system simulator.

The present invention will be described referring to the drawings of the embodiments.

Figure 4:
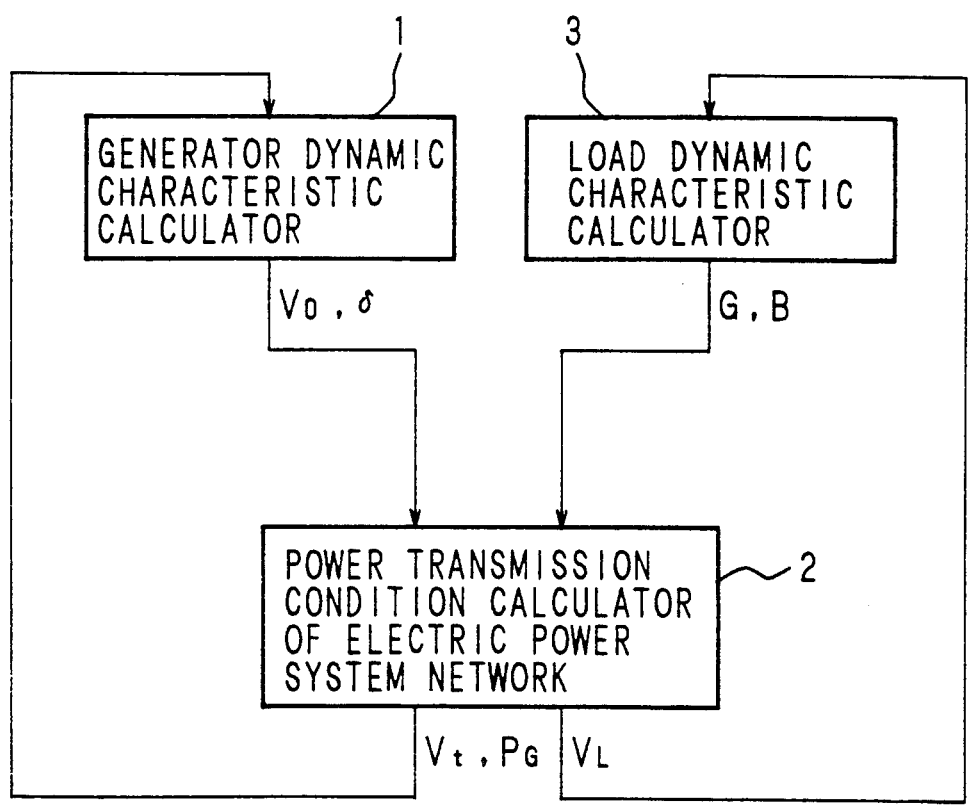
FIG. 4 is a block diagram showing one example of a configuration of the first invention of the electric power system simulator.

FIG. 4 is a block diagram showing one example of a configuration of the first invention of the electric power system simulator.

The first invention comprises generator dynamic characteristic calculator 1 as first calculating means, power transmission condition calculator 2 of electric power system network as third calculating means, and load dynamic characteristic calculator 3 as second calculating means.

Figure 5:
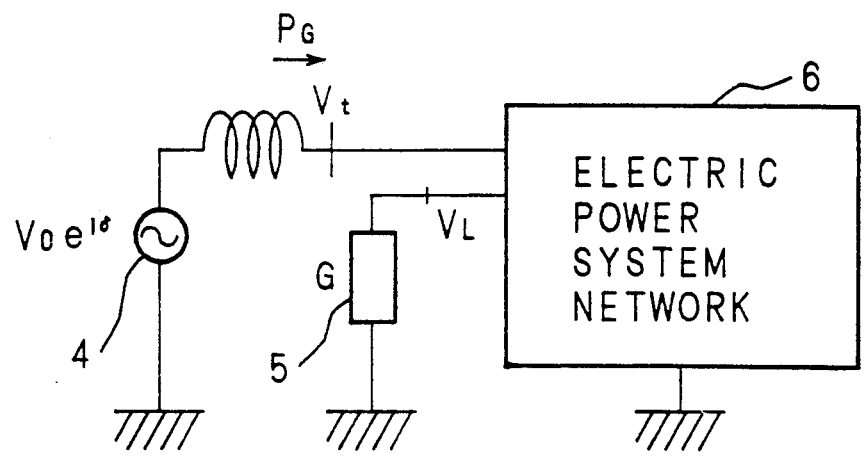
FIG. 5 is a circuit diagram showing a concept of an electric power system.
Figure 6:
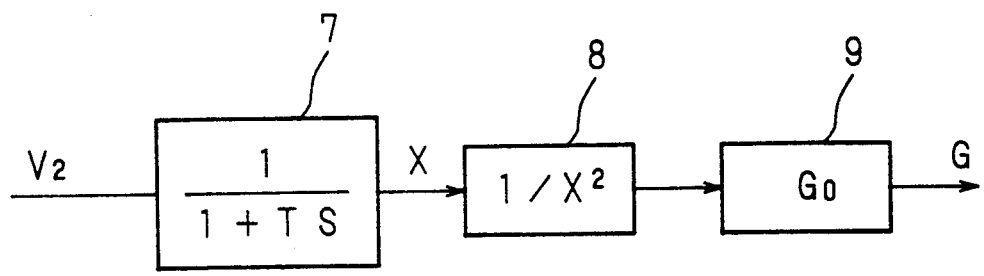
FIG. 6 is a block diagram showing transfer functions indicating a load dynamic characteristic of an electric power system.

FIG. 5 is a circuit diagram showing a concept of an electric power system, and FIG. 6 is a block diagram showing transfer functions indicating a load dynamic characteristic of an electric power system.

In FIG. 5, reference numeral 4 denotes a voltage source (Voe$^i$) for an internal induced voltage of the generator, numeral 5, an equivalent resistance (conductance) G of a load, and numeral 6, an electric power system network.

In FIG. 6, reference numeral 7 denotes a primary delay system 7 for an input $V_2$, numeral 8, a function which outputs "$1/X^2$" to an input "X", and numeral 9, a block which multiplies any input by a constant $G_0$. Therefore, in the block diagram of FIG. 6, the conductance G is obtained concerning the input $V_2$. For simplification of explanation, only the conductance G is treated but susceptance B can be also treated in the same way.

The generator dynamic characteristic calculator 1 performs calculation searching for a difference between movement of a generator rotor, that is, output energy of a turbine and electric energy of the generator and calculation for computing an outputted voltage, that is, a current flowing through a field circuit. By the generator dynamic characteristic calculator 1, an amplitude $V_0$ and a phase δ of the internal induced voltage of the generator are calculated, and G, B of the load admittance are calculated by the load dynamic characteristic calculator 3.

As can be seen from FIG. 5, all variables necessary for the electric power system network calculations, that is, an amplitude $V_0$ and phase δ of the voltage source 4, an admittance (conductance G and susceptance B) of the load 5, and an impedance as system information are determined by the generator dynamic characteristic calculator 1 and the load dynamic characteristic calculator 3.

When these values are determined, voltages at all nodes and currents in all branches are obtained as is shown in, for example, "Graph Theory Circuit" (published by Shokodo in 1974, pp 109-115), thus by using these values, the power transmission condition calculator 2 of an electric power system network calculates an A.C. current flowing through each element of the electric power system by the system network calculation and can easily calculate an output power $P_G$, terminal voltage $V_t$ of the generator and an A.C. voltage $V_L$ at a load installation point.

Further, a non-linear characteristic of the load 5 can be simulated with a dynamic characteristic of the load 5 as shown in FIG. 6. In a primary delay system 7, character T denotes a time constant and S, differential. Thus, assuming that $V_L$ is constant in FIG. 6, conductance G can be expressed by the following equation (1).

$$G = G_0/V_L^2 \qquad (1)$$

Thus power P consumed in the load 5 is expressed by the following equation (2).

$$\begin{aligned} P &= V_L^2 G \\ &= G_0 \end{aligned} \qquad (2)$$

That is, regardless of $V_0$ value, the consumed power P becomes constant value $G_0$, thus the constant power characteristic is simulated.

Thus, when alternately repeating processing by the generator dynamic characteristic calculator 1 and the power transmission condition calculator 2 of an electric power system network and processing by the load dynamic characteristic calculator 3, the processing proceeds one by one time step of integration, and a condition change of the electric power system including generators can be serially simulated.

In the above embodiment, the conventional repeated calculations become unnecessary which are required when the power transmission condition of the electric power system network is calculated, thus the operation time becomes constant and an electric power system simulator with high speed operation capability can be obtained. Further, because the operation time becomes constant, this simulator can cope with the real time simulation.

Figure 7:
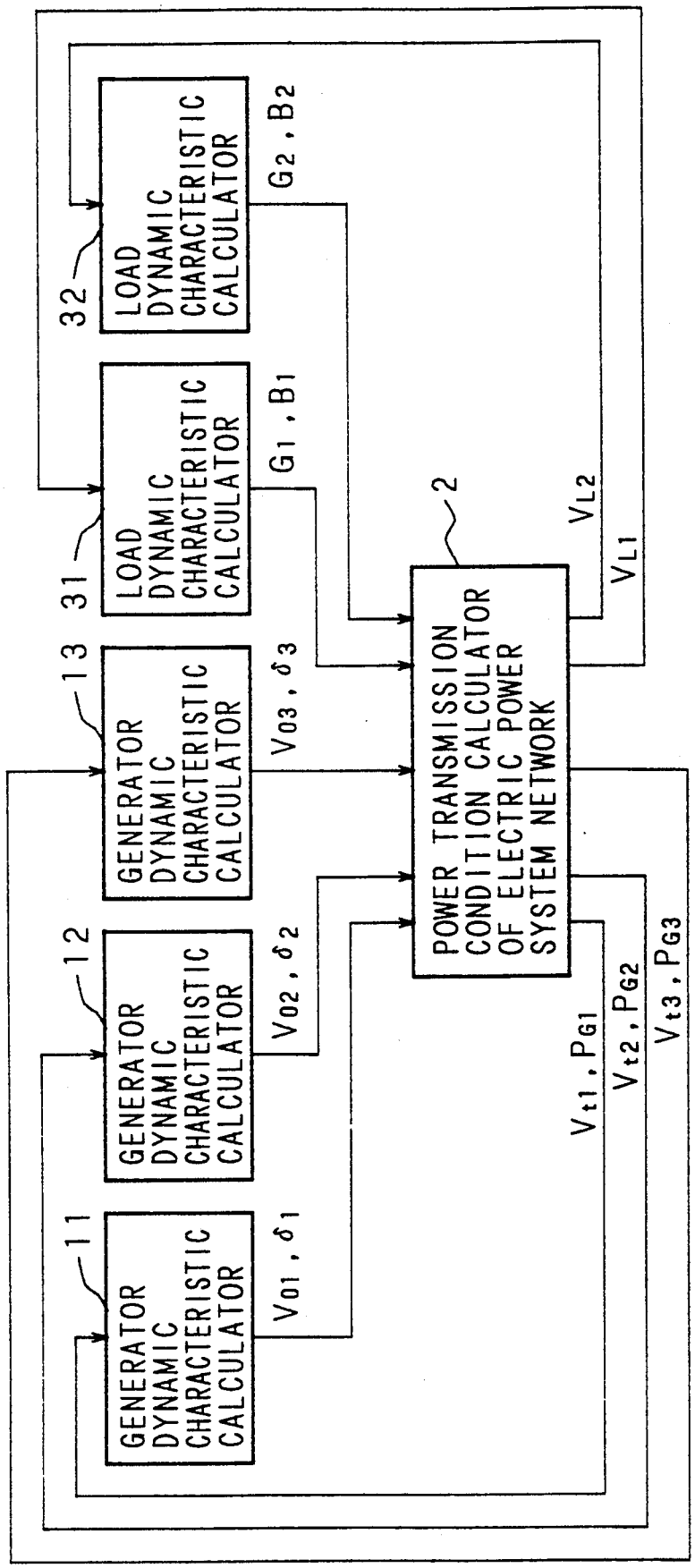
FIG. 7 is a block diagram showing a configuration of another embodiment of the first invention.

FIG. 7 is a block diagram showing a configuration of another embodiment of the first invention.

In this embodiment, in order to apply the electric power system simulator of the first invention to an electric power system comprising three generators and two loads, three of the generator dynamic characteristic calculators 1 as the first calculating means 11, 12 and 13 are provided coping with three generators #1, #2, #3, and two of the load dynamic characteristic calculators 3 as the second calculating means 31, 32 are also provided coping with two loads. Further, the power transmission condition calculator 2 of an electric power system network as the third calculating means is provided only one.

Then respective amplitudes $V_{01}$, $V_{02}$ and $V_{03}$ and phases $δ_1$, $δ_2$ and $δ_3$ of the internal induced voltages of the generator of the three generators are calculated by the generator dynamic characteristic calculators 11, 12, 13 and respective admittances $G_1$, $G_2$, $B_1$ and $B_2$ of the two load are calculated by the load dynamic characteristic calculators 31, 32. By using these values, respective output powers $P_{G1}$, $P_{G2}$, $P_{G3}$ and terminal voltages $V_{t1}$, $V_{t2}$, $V_{t3}$ of the three generators, and respective voltages $V_{L1}$, $V_{L1}$ at two load installation points can be calculated with ease and at a high speed by the power transmission condition calculator 2 of an electric power system network.

Processing functions of the generator dynamic characteristic calculators 11, 12, 13 and the load dynamic characteristic calculators 31, 32 are independent one another and not restricted by order of calculation operation, therefore processing in any order of calculation is acceptable. Further, when a plurality of calculating units are available, parallel calculation can be performed by executing each processing function by means of each calculating unit. Such parallel calculation can reduce an operation time as a whole.

As mentioned above, according to the first invention, the simulator comprises the generator dynamic characteristic calculator 1 as the first calculating means which calculates the generator dynamic characteristic, the load dynamic characteristic calculator 3 as the second calculating means which calculates the load dynamic characteristic, and the electric power system network calculator 2 as the third calculating means which calculates the power transmission condition of an electric power system network. The generator dynamic characteristic calculator 1 receives an output power and a terminal voltage of the generator to obtain an amplitude and a phase of the internal induced voltage of the generator after every one time step of integration, and the load dynamic characteristic calculator 3 receives an A.C. voltage at a load installation point to calculate a load equivalent admittance at every one time step of integration, and the power transmission condition calculator 2 receives each data obtained from the generator dynamic characteristic calculator 2 and the load dynamic characteristic calculator 3 and an electric power system network impedance to calculate an A.C. current flowing in each element of the electric power system according to an algorithm for the system network calculation to obtain the output power and terminal voltage of the generator, and then a condition change of the electric power system including generators is serially simulated by alternately performing the calculations executed by the generator dynamic characteristic calculator 1 and the load dynamic characteristic calculator 3 and the calculation executed by the power transmission condition calculator 2. Therefore, repeated calculations necessary for the conventional simulator becomes unnecessary and a quantity of calculation becomes constant, as a result the real time simulation becomes possible.

Figure 8:
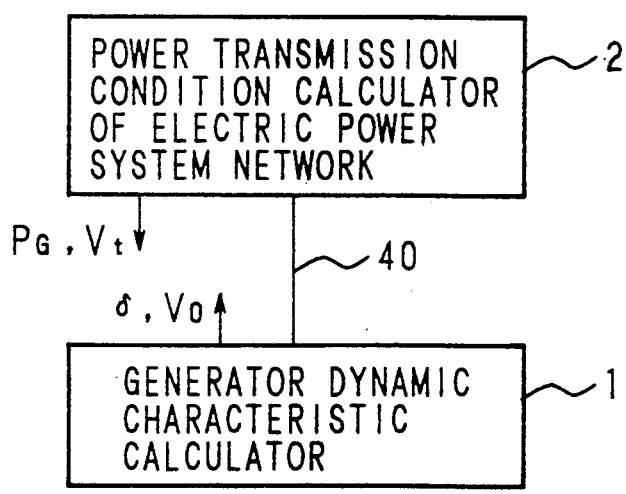
FIG. 8 is a block diagram showing one example of a configuration of the second invention of the electric power system simulator.

FIG. 8 is a block diagram showing one example of a configuration of the second invention of the electric power system simulator.

The simulator of the second invention comprises generator dynamic characteristic calculator 1 as first calculating means, power transmission condition calculator 2 of an electric power system network as second calculating means, and a communication line 40 as communicating means which connects both the calculators 1 and 2.

The generator dynamic characteristic calculator 1 as the first calculating means performs calculation for obtaining a difference between movement of a generator rotor, that is, output energy of a turbine and electric energy of the generator and calculation for obtaining an outputted voltage, that is, a current flowing in a field circuit. The generator dynamic characteristic calculator 1 receives an output power $P_G$ and terminal voltage $V_t$ of the generator to output an amplitude $V_0$ and phase $\delta$ as an internal voltage information of the generator after every one time step of integration.

The power transmission condition calculator 2 of an electric power system network as the second calculating means receives the amplitude $V_0$ and the phase $\delta$ as the internal voltage information of the generator calculated by the generator dynamic characteristic calculator 1 and various constants of the electric power system network are used to perform A.C. network calculation to output the output power $P_G$ and the terminal voltage $V_t$ of the generator.

In addition, the various constants of the electric power system network include, for example, are A.C. impedance of a transmission line of the power system network, equivalent A.C. impedance of a load, and winding ratio of a transformer.

The communication line 40 transfers, between the generator dynamic characteristic calculator 1 and the power transmission condition calculator 2 of an electric power system network, information such as an amplitude $V_0$, phase $\delta$, generator output power $P_G$, terminal voltage $V_t$ outputted from the calculator 1 and calculator 2 respectively.

When the processing of the generator dynamic characteristic calculator 1 and the processing of the power transmission condition calculator 2 of an electric power system network are alternately repeated communicating information each other via the communication line 40, a condition change of the electric power system network can be serially simulated and calculation equivalent to that of the conventional simulation can be executed by a plurality of calculators.

In the above embodiment, system analysis calculations are divided into two parts, that is, generator dynamic characteristic calculating part and power transmission condition calculating part of an electric power system network, thus it is possible to select the respective optimum systems as the respective calculator, as a result calculation processing is accelerated. Further, when a quantity of calculation is increased due to plural generators and thus new calculators are added and calculation for one generator or plural generators are assigned to one new calculators or a plurality of them, extending of an operation time due to increase in a number of generators can be avoided.

Figure 9:
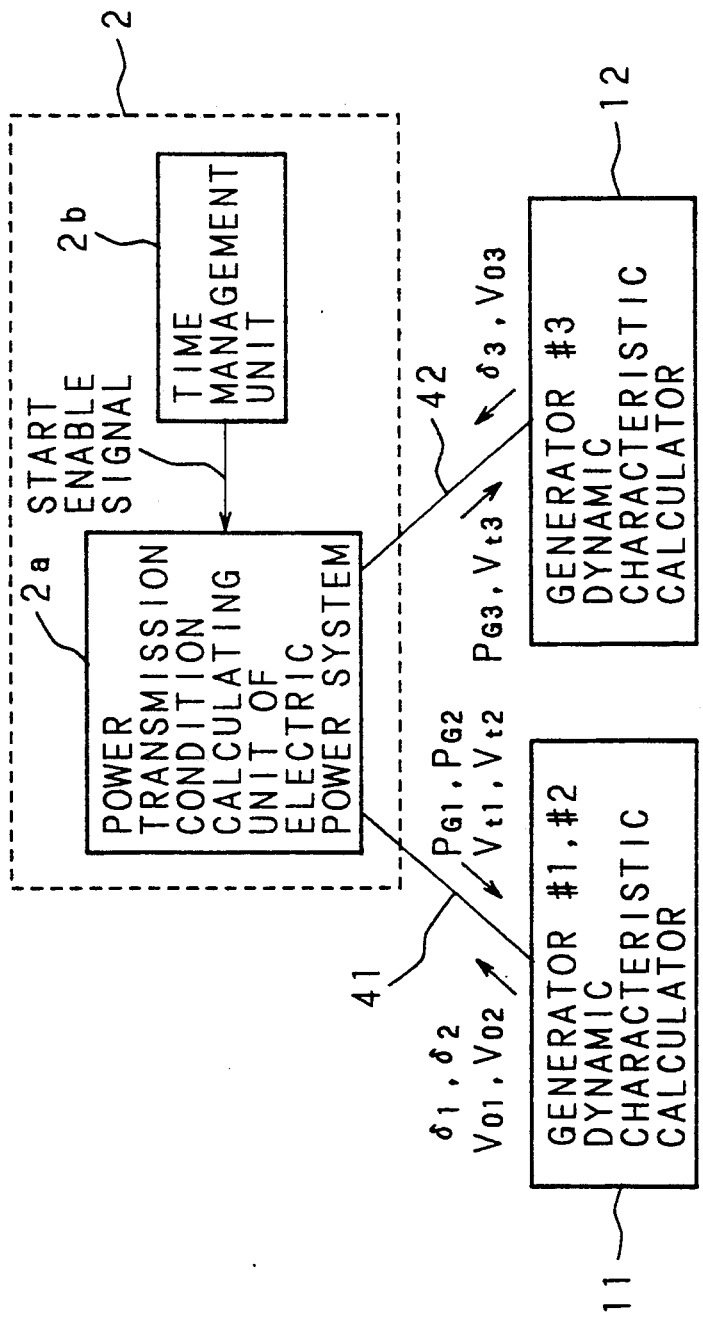
FIG. 9 is a block diagram showing a configuration of another embodiment of the second invention.

FIG. 9 is a block diagram showing another embodiment of a configuration of the second invention.

In this embodiment, in order to apply the electric power system simulator of the second invention to an electric power system including three generators #1, #2, #3, the simulator is provided with two generator dynamic characteristic calculators 1 of 11, 12. By the way, a power transmission condition calculator 2 of an electric power system network is provided only one, but includes a power transmission condition calculating unit 2a of an electric power system network which is an original function and a time management unit 2b.

Further, numeral 41 denotes communication line connecting the power transmission condition calculating unit 2a of an electric power system network with the generator dynamic characteristic calculator 11, numeral 42 denotes communication line the power transmission condition calculating unit 2a with the generator dynamic characteristic calculator 12.

In this embodiment, the generator dynamic characteristic calculator 11 performs calculation concerning the two generators #1, #2, and the generator dynamic characteristic calculator 12 performs calculation concerning one generator #3.

It is assumed that the generator dynamic characteristic calculator 11 is the so-called data-driven type computer which starts calculation on receiving output powers $P_{G1}$ and $P_{G2}$, terminal voltages $V_{t1}$, $V_{t2}$ of the generators #1 and #2, respectively. Further, it is assumed that the generator dynamic characteristic calculator 12 is also the so-called data-driven type computer which starts calculation on receiving an output power $P_{G3}$, terminal voltage $V_{t3}$ of the generator #3.

Further, it is assumed that the power transmission condition calculating unit 2a of an electric power system network is originally the data-driven type computer which starts calculation on receiving internal induced voltage amplitudes $V_{01}$, $V_{02}$, $V_{03}$ and phases $\delta_1$, $\delta_2$, $\delta_3$ of the generators #1, #2 and #3. Start time of calculation of the power transmission condition calculating unit 2a of an electric power system network is controlled by the time management unit 2b at every one time step of integration.

Therefore, the power transmission condition calculating unit 2a of an electric power system network starts calculation when it finishes receiving of the above information and gets a start enable signal for calculation from the time management unit 2b. The generator dynamic characteristic calculators 11 and 12 automatically start calculation when they output via the communication lines 41 and 42 the output powers $P_{G1}$, $P_{G2}$, $P_{G3}$ and terminal voltages $V_{t1}$, $V_{t2}$, $V_{t3}$ of the generators #1, #2, #3 which have been calculated by the power transmission condition calculating unit 2a of the electric power system network. Therefore, when the time management unit 2b cyclically gives the calculation start enable signal to the power transmission condition calculating unit 2a of the electric power system network in the same time interval, the whole of the calculation is executed in the same time interval.

Further, when making the time interval set by the time management unit 2b coincide with every one time step of integration, variations of many variables during calculation processing vary in synchronization with real time transition, thus the so-called real time simulation is realized.

Or, the time interval set by the above time management unit 2b can be set in any length, thus the simulation at a desired speed can be realized.

As mentioned above, the simulator of the second invention comprises the generator dynamic characteristic calculator 1 as the first calculating means which calculates the generator characteristic, the electric power system network calculator 2 as the second calculating means which calculates power transmission condition of an electric power system network and the communication line 40 as the communicating means which communicates information between the generator dynamic characteristic calculator 1 and the electric power system network calculator. Then the generator dynamic characteristic calculator 1 receives information on output power and terminal voltage of the generator outputted from the electric power system network calculator 2 to calculate information on internal induced voltage of the generator after every one time step of integration and outputs this information to the electric power system network calculator 2 via the communication line 40, while the electric power system network calculator 2 calculates the power transmission condition of the electric power system network at a predetermined time by using information outputted from the generator dynamic characteristic calculator 2 and various constants of the electric power system network to output information on output power and terminal voltage of the generator to the generator dynamic characteristic calculator 1 via the communication line 40, thus by alternately performing calculation by the generator dynamic characteristic calculator 1 and the electric power system network calculator, dynamic variations of the electric power system including generators are serially simulated. Therefore, a plurality of the calculator can be used depending on contents of calculation, thus when a quantity of calculation is increased due to increase in a number of generators in the electric power system to be simulated, calculation concerning one or plural generators are decentralized, thereby extending of the operation time can be avoided.

Further, in the second invention, the electric power system network calculating means 2 comprises the calculating unit which calculates the power transmission condition of the electric power system network and the time management unit which directs the calculating unit to start calculation at every one time step of integration. Thus time management for calculation execution can be performed in every one time step of integration, and time management for the whole system becomes possible, as a result the real time simulation is realized.

Figure 10:
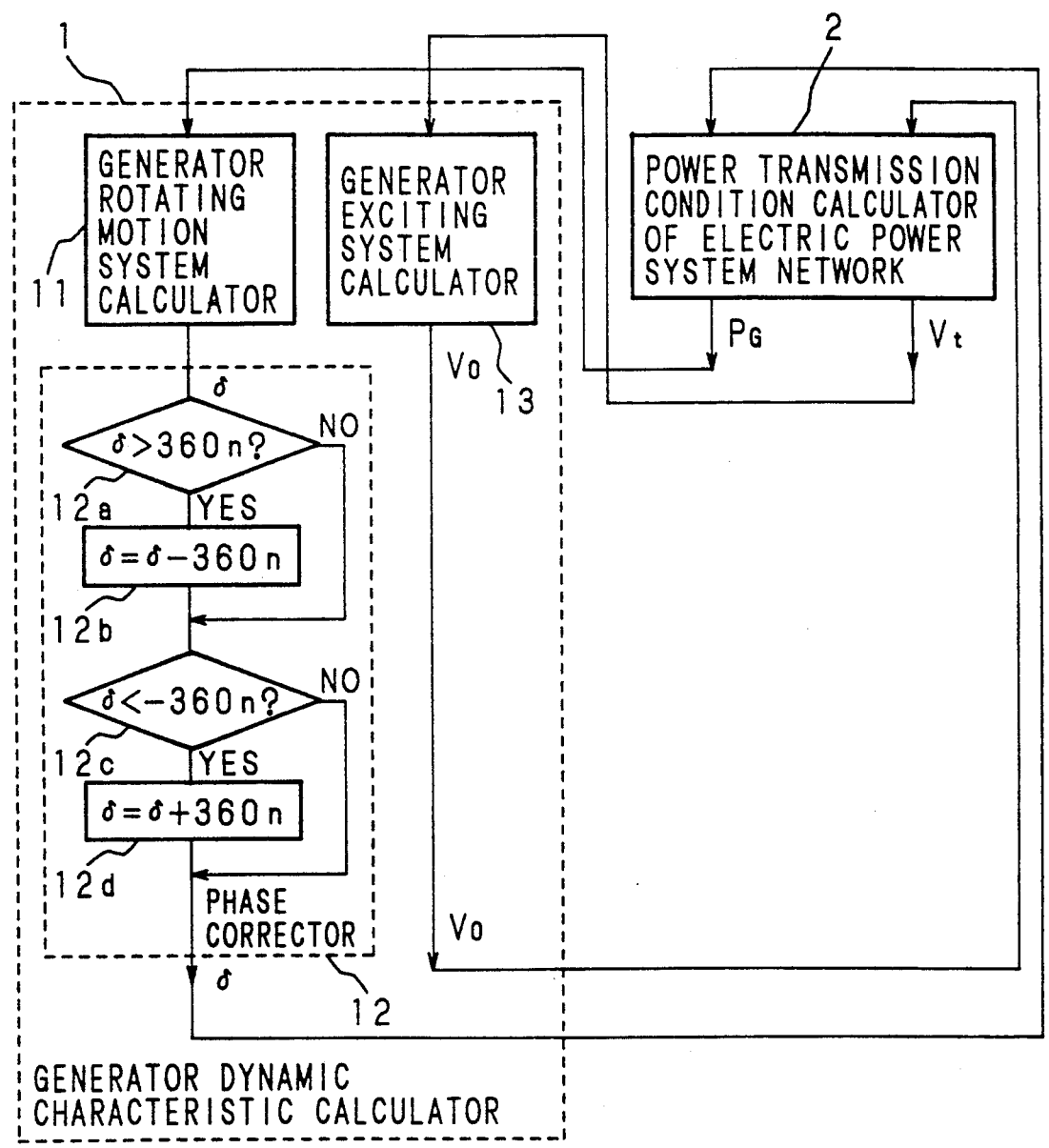
FIG. 10 is a block diagram showing a configuration of one embodiment of the third invention of the electric power system simulator and flows of information at the time of calculating each element.

FIG. 10 is a block diagram showing a configuration of one embodiment of the third invention and a flow of information at the time of calculation execution of each element.

The simulator of the third invention comprises a generator dynamic characteristic calculator 1 as first calculating means and an electric power system network calculator 2 as second calculating means. Further, the generator dynamic characteristic calculator 1, includes generator rotating motion system calculator 11 as phase calculating means, correcting means for correcting a phase $\delta$ of an internal induced voltage of the generator (hereinafter to be called phase corrector 12) and generator excitation system calculator 13 as amplitude calculating means.

Now, an amplitude $V_0$ and phase $\delta$ of the internal induced voltage of the generator will be calculated by the generator dynamic characteristic calculator 1.

The phase $\delta$ is calculated by, for example, the following equation (3), $$\delta = \int w_0[\{(P_M - P_G)/M \, dt\} - 1.0]dt \qquad (3)$$

In the equation (3), $P_G$ is the value of an output power of the generator which is inputted to the generator dynamic characteristic calculator 1, and $w_0$, $M$, $P_M$ are constants.

The phase $\delta$ is once calculated by the generator rotating motion system calculator 11 and thereafter corrected by the phase corrector 12. That is, when it is decided in Step 12a that the phase $\delta$ exceeds a predetermined value 360 n°, the phase $\delta$ is determined to be "$\delta - 360$ n" at step 12b. On the contrary, when it is decided in Step 12c that the phase $\delta$ is less then $-360°$, the phase $\delta$ is determined to be "$\delta + 360$ n" in Step 12d. By performing these processings, the phase $\delta$ is kept to be within the range of $-360°$ through $+360°$.

On the other hand, the amplitude $V_0$ of the induced voltage of the generator is calculated by the generator excitation system calculator 13 to be outputted.

The amplitude $V_0$ and phase $\delta$ of the internal induced voltage of the generator obtained by the generator dynamic characteristic calculator 1 are inputted to the electric power system network calculator 2. The electric power system network calculator 2 performs A.C. network calculation by using information such as an A.C. impedance of an electric power system network transmission line, an equivalent A.C. impedance of a load, and a winding ratio of a transformer to output the output power $P_G$ and terminal voltage $V_t$ of the generator. Further, the output power $P_G$ and terminal voltage $V_t$ of the generator are respectively inputted to the generator rotating motion system calculator 11 and the generator excitation system calculator 13 of the generator dynamic characteristic calculator 1 to calculate the phase $\delta$ and amplitude $V_0$ after every one time step of integration.

Now, since the phase $\delta$ is always used as an argument of a trigonometric function, the following expressions are established from the nature of the trigonometric function, $\sin\delta = \sin(\delta - 360 \text{ n})$ $\cos\delta = \cos(\delta - 360 \text{ n})$ thus even subtracting or adding 360 n from or to the phase δ in Step 12b or Step 12d does not affect the result of calculation. In addition, the phase δ corresponds to a phase of the generator rotor, and of course the same effect is obtained even when the phase of the generator rotor is corrected.

Further, it is possible to empirically determine the value of n in 360 n, but when predetermined accuracy and a significant number of digits proper to the computer are known, the n can be determined as follows.

For example, assuming that the significant number of digits of the computer is a digits in decimal notation and phase accuracy is expressed by b digits below the decimal point in a unit of degree, a number of digits above the decimal point becomes "a−b". Therefore, an integer of "a−b" digits becomes the maximum numerical value within this range. The "a−b" is becomes a number smaller than 10 to the "a−b" power. That is, 360 n should be selected so as to become smaller than this value. In the above explanation, the unit is a degree but when using a radian as the unit, the predetermined value should be accordingly changed to $2\pi n$, and the number of digits b below the decimal point should be increased.

In the same way as the conventional simulator, this embodiment is provided with means, that is, phase corrector 12 which decides whether the phase δ exceeds a predetermined set value or not after calculation of the phase δ, and which, when it exceeds the set value, so controls the phase δ that it always remains within the range of the set values by adding or subtracting the predetermined set value to or from the phase δ. Therefore, such condition is avoided that the phase δ falls within an error range of the computer system numerical calculation and thus continuation of calculations becomes impossible. Therefore, the simulation does not become impossible.

Figure 11:
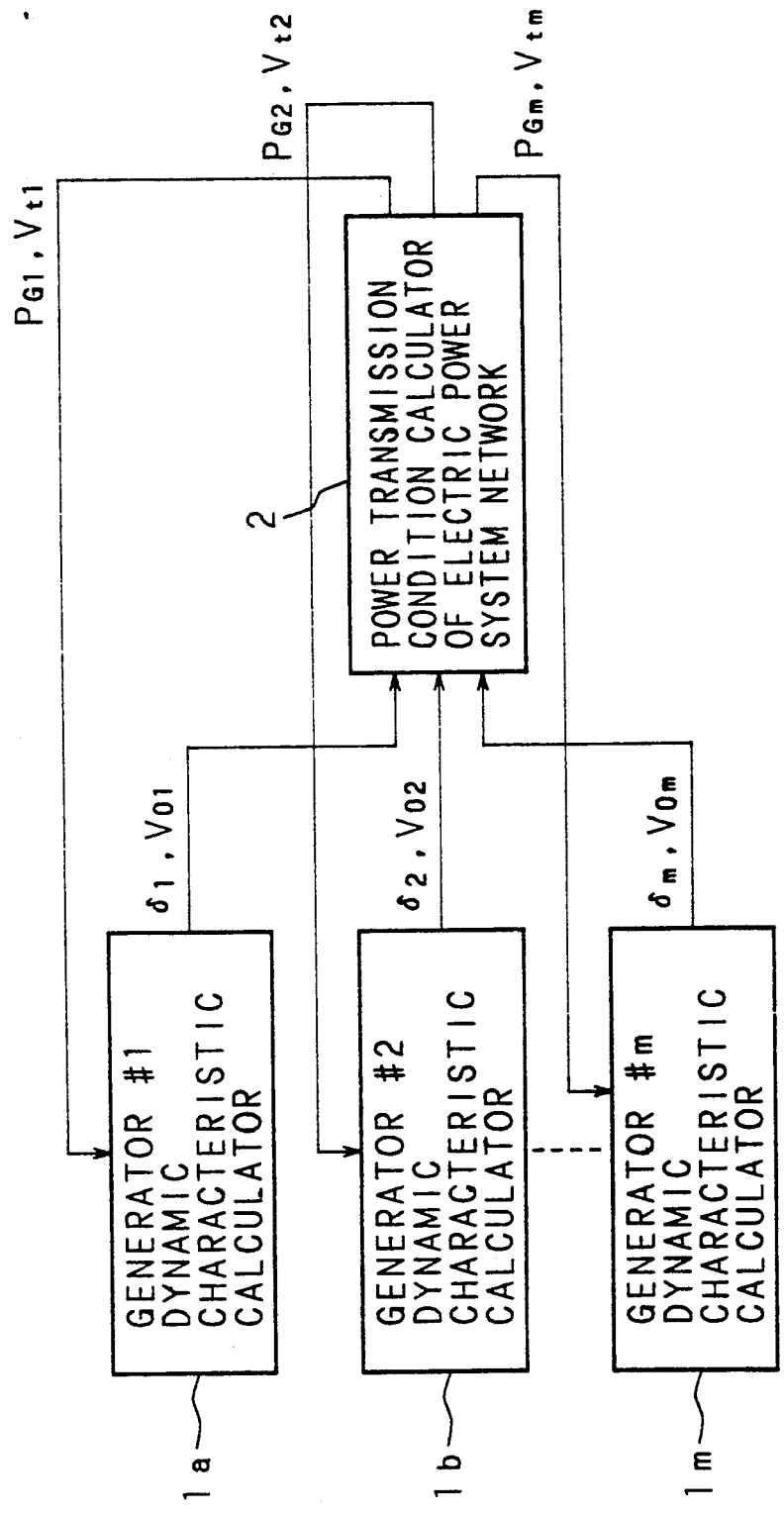
FIG. 11 is a block diagram showing a configuration of another embodiment of the third invention, FIG. 12 (a), (b) and (c) are waveform charts showing changes in time series of phases of internal induced voltages of the generator.

FIG. 11 is a block diagram showing a configuration of another embodiment of the third invention. This embodiment includes a plurality of generators in the electric power system. In FIG. 11, reference numerals 1a, 1b ... 1m denote dynamic characteristic calculators for the respective generators #1, #2 ... #m. Each of these generator dynamic characteristic calculator 1a, 1b ... 1m has the same function as the phase corrector 12 of the above embodiment.

Calculation procedures are as follows.

First, output voltage $P_{G1}$, $P_{G2}$ ... $P_{Gm}$ and terminal voltages $V_{t1}$, $V_{t2}$ ... $V_{tm}$ of the generators are calculated by electric power system network calculator 2, then the calculated values are inputted to the generator dynamic characteristic calculators 1a, 1b ... 1m to calculate amplitudes $v_{01}$, $V_{02}$ ... $V_{0m}$ and phases $\delta_1$, $\delta_2$ ... $\delta_m$ of the internal induced voltages of the generator. At this time the calculations of the generator dynamic characteristic calculators 1a, 1b ... 1m are not restricted by order of the calculations. In the case where there are a plurality of calculation units, the calculations may be parallel-processed by these units or may be serial-processed by one unit.

Figure 12A:
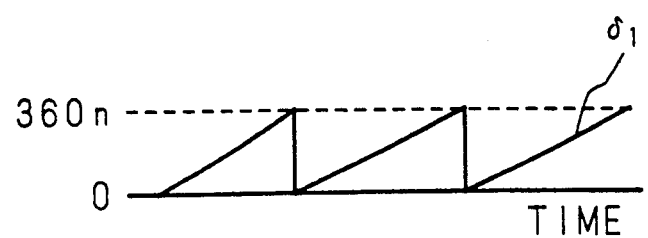

FIG. 12(a), (b) and (c) are waveform charts showing changes in time series of the phases $\delta_1$, $\delta_2$ ... $\delta_m$ of the internal induced voltages of the generator, where the abscissas represent times and the ordinates represent phases (degree) respectively.

The phase $\delta_1$ shown in FIG. 12(a) tends to increase monotonically and when it reaches a predetermined values of 360 n, it is subtracted by 360 n to become 0.

Figure 12B:
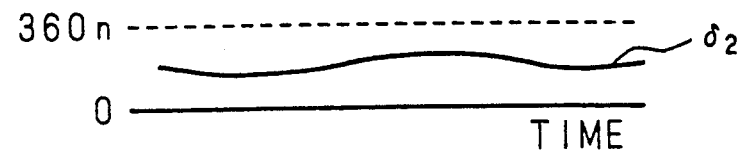
Figure 12C:
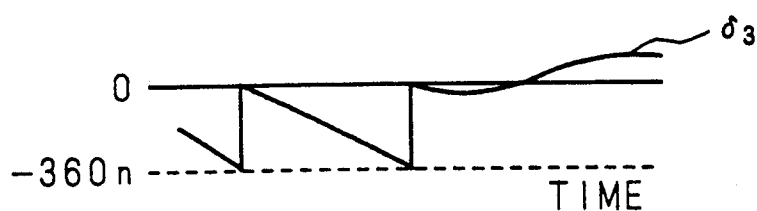

The phase $\delta_2$ shown in FIG. 12(b) somewhat changes but does not exceed the range of two set values and is not corrected. The phase $\delta_3$ shown in FIG. 12(c) tends to decrease and when it reaches a predetermined value of −360 n, it is subtracted by −360 n, that is, added by +360 n to become 0.

In this way, the phase δ is kept within the range of −360 n to +360 n. The third invention is effective to simulation of a system lasting for a long time after the phase δ has been kept within the range of two predetermined set values and a generator has caused step-out, or to simulation of a system including a stopped generator, or to simulation of a system including two A.C. systems with different frequencies which are connected with a D.C. transmission system.

As mentioned above, the third invention comprises the generator dynamic characteristic calculator 1 as the first calculating means which calculates the generator dynamic characteristic and the electric power system network calculator 2 as the second calculating means which calculates power transmission condition of an electric power system network. Then the generator dynamic characteristic calculator 1 receives information on an output power and terminal voltage of the generator outputted from the electric power system network calculator 2 to calculate an amplitude and a phase of the internal induced voltage of the generator after every one time step of integration to output them to the electric power system network calculator 2, and the electric power system network calculator receives the amplitude and the phase of the internal induced voltage of the generator outputted from the generator dynamic characteristic calculator and various constants of the electric power system network to calculate the power transmission condition of the electric power system network at a predetermined time to output information on the output power and terminal voltage of the generator to the generator dynamic characteristic calculator 1. Further when a phase in the generator dynamic characteristic calculator exceeds a predetermined set value obtained by multiplying 360° by an integer, a value which is subtracted from this phase value by the predetermined value is determined as the phase, and then by making the generator dynamic characteristic calculator and the electric power system network calculator perform calculations alternately, dynamic changes of the electric power system including generators is serially simulated. Thus, in the third invention, after the phase δ is calculated in the same way as the conventional, a check is made whether the calculated phase value exceeds predetermined set values or not. When it exceeds the set value, adding or subtracting the set value to or from the phase δ can always bring back the phase δ within the range of two set values, thereby causing no trouble with calculation in the computer system.

Now, the fourth invention will be explained. The simulator of the fourth invention comprises the same configuration as the simulator which uses the conventional decentralized computer shown in FIG. 2, and calculation procedure itself is basically the same as that of the conventional electric power system simulator shown in FIG. 3.

Figure 2:
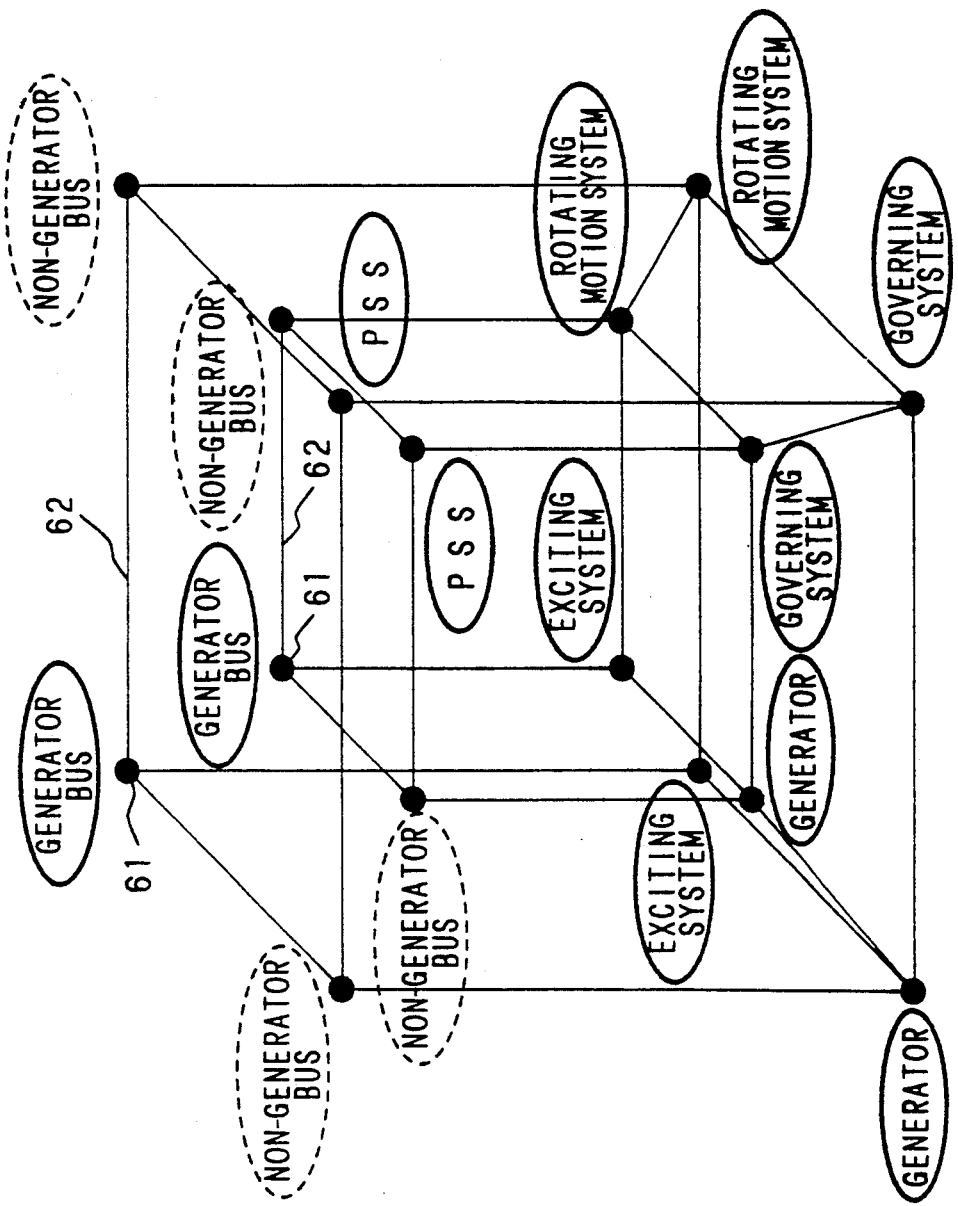
FIG. 2 is a schematic diagram showing a structure of an electric power system simulator using a conventional decentralized type computer having a plurality of CPUs and of the fourth invention of the electric power system simulator of the present invention.

The electric power system simulator shown in FIG. 2 uses the decentralized type computer having a plurality of CPUs 61, to each of which each different equation representing a generator, excitation system, PSS, or governing system each of which is a element of the electric power system is assigned. Calculations on the respective elements are decentralized-processed by the respective CPUs 61, thereby a load on each CPU 61 is alleviated and the calculations are performed at a high speed as a whole.

By the way, reference numeral 62 represents a communication line connecting between the respective CPUs.

Figure 3:
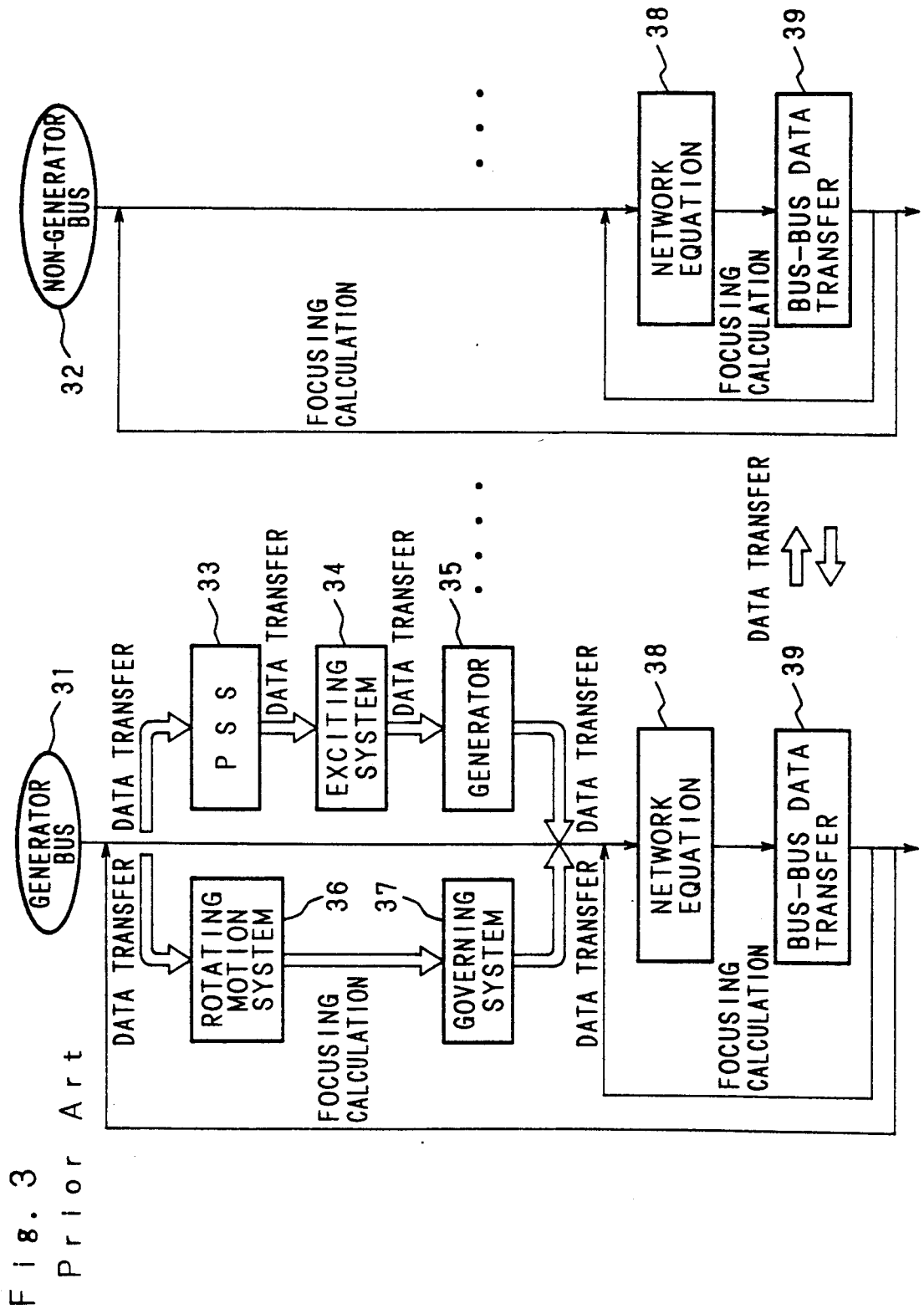
FIG. 3 is a flowchart showing processing procedures relating to one bus constituting a element of the electric power system in the electric power system simulator shown in FIG. 2.

The electric power system simulator of the fourth invention obtains a solution from the following equations (4), (5) and (6) in the network calculation shown in FIG. 3.

$$Vii_{(K+1)} = -(Y_G * V_G + \Sigma Yij * Vi_{(K)})/Yii \quad (4)$$

$$Iii_{(K+1)} = V_G * V_G + \Sigma Yij * Vj_{(K+1)} + Yii * Vii_{(K+1)} \quad (5)$$

$$Iii_{(K+1)} \rightarrow 0$$

where
I: current
Y: admittance
V: voltage

That is, the solution employs a method of substituting V as a known quantity in an equation $$I = YV$$

and of calculating mere algebraic equation. First, using a determinant of $$I = YV.$$

The equation (4) is calculated to obtain a new $V_{ii(k+1)}$. The underlined part $Y_G*V_G$ of the equation (4) is a term corresponding to an equivalent current source in the conventional method and is a current in a generator bus. In addition, $\Sigma Yij*Vi_{(k)}$ is a sum of currents in a bus j directly connected to a bus i at a present time (k).

Next, using $Vij_{(k+1)}$ representative of new (k+1) condition obtained from the equation (4), the equation (5) is solved to obtain new $Iii_{(k+1)}$. The equation (6) shows that one value of $Iii_{(k+1)}$ obtained from the equation (5) does not coincide with the other, thus the focusing calculation is performed until I becomes 0.

As mentioned above, in the fourth invention, when performing calculation concerning one bus, the calculation is executed using only information concerning buses directly connected to the bus through a transmission line or a transformer, thus the CPUs which simulate the buses should be connected each other according to system construction, as a result focusing of the network calculation can be carried out at a high speed. Further, provision of a slack bus used for the conventional bus is not necessary, and because all the buses are equal, a bus or transmission line can be easily added or changed, thus flexibility and trouble-withstandability of the decentralized-CPU computer system are effectively utilized.

In addition, when employing a method of calculation by using already-obtained $Vj_{(k+1)}$ serially instead of $Vj_{(k)}$ of equation (4) and obtaining $Vi_{(k+1)}$ of remaining buses, a number of times of calculation until focusing is further reduced.

As mentioned above, according to the fourth invention, when simulation of an electric power system is performed by the decentralized type computer, the network calculation of one bus is executed on the basis of only information on buses which are directly connected to the bus. Thereby the network calculation is fast focused and thus high speed calculation is enabled and a high speed simulator is realized which can analyze an electric power system network phenomenon at almost the same speed as the real system phenomenon proceeding speed.

The electric power system simulator of the fifth invention will be explained with reference to a block diagram of FIG. 13.

Figure 13:
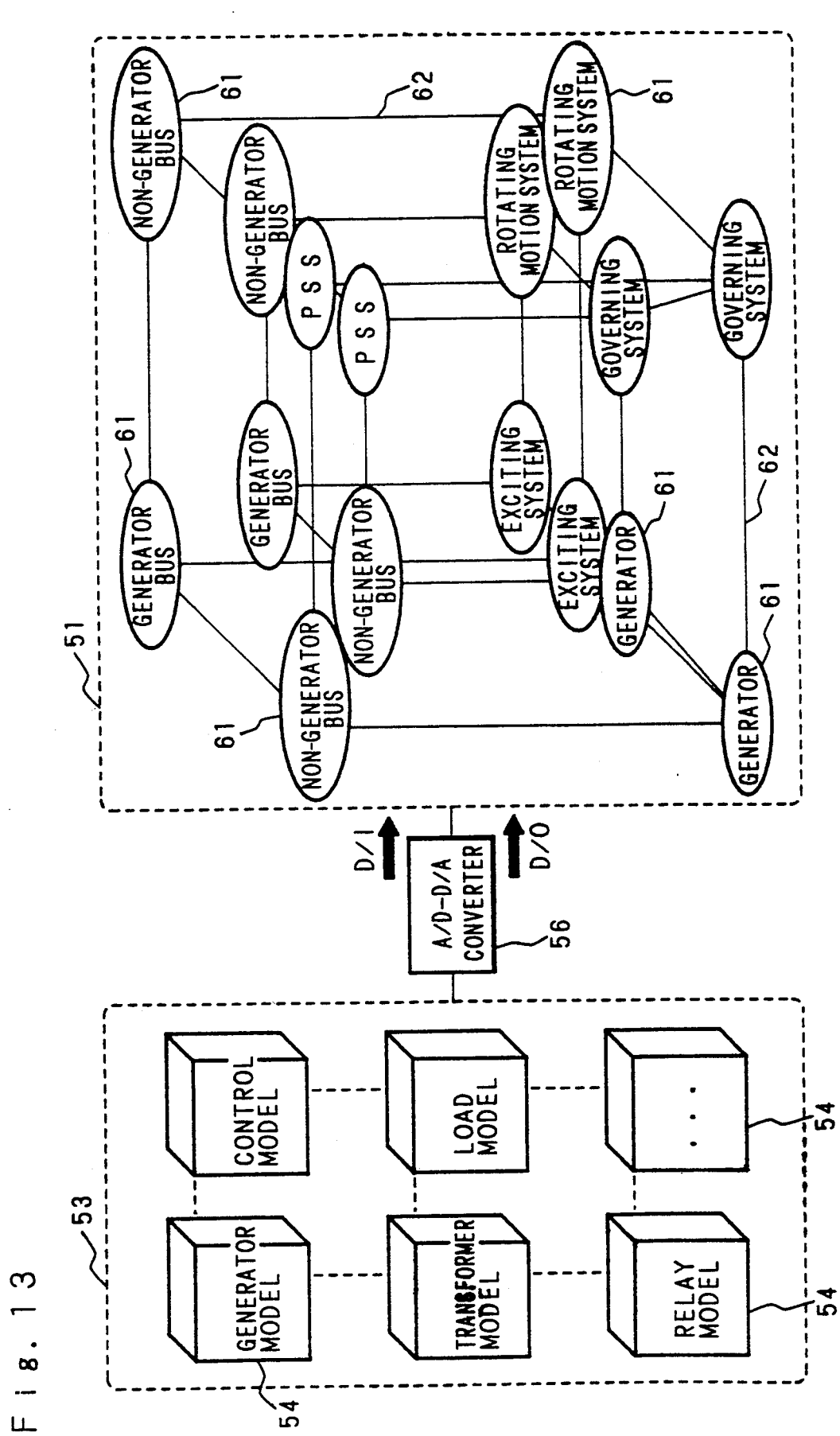
FIG. 13 is a block diagram showing a structure of the fifth invention of the electric power system simulator.

In FIG. 13 reference numeral 51 denotes the same electric power system simulator as a digital type electric power system simulator utilizing the conventional decentralized computer system shown in FIG. 2. The fifth invention comprises the digital type electric power system simulator 51, an analog type electric power system simulator 53 and an A/D-D/A converter 56 which transfers data between both the simulators.

The analog type electric power system simulator 53 comprises a plurality of combined miniature simulators 54 each of which simulates each element such as a generator, control system, transformer, load or a relay of an electric power system.

The digital type electric power system simulator 51 performs the same calculation as the electric power system simulator utilizing, for example, the decentralized type computer system of the above fourth invention.

Such a digital type electric power system simulator 51 and an analog type electric power system simulator 53 are connected with the A/D-D/A converter 56, whereby addition or a change of a system to be simulated is facilitated, as a result a detailed analysis of a phenomenon generated in the analog type electric power system simulator 53 becomes possible.

That is, analog data outputted from the analog type electric power system simulator 53 is converted into digital signals at the A/D-D/A converter 56 to give them to the computer, whereby phenomena of each system in the digital type electric power system simulator 51 corresponding to each simulator 54 configurating the analog type electric power system simulator 53 become analyzable. Thereby modeling of each system in the digital type electric power system simulator 51 can be performed more precisely.

On the contrary, digital data outputted from the digital type electric power system simulator 51 is converted into analog signals at the A/D-D/A converter 56 to add them to analog data outputted from the analog type electric power system simulator 53, whereby an analysis of a large scale electric power system which has been impossible with the conventional simulator becomes possible with simple condition setting.

Further, analog data outputted from the analog type electric power system simulator 53 is substituted by analog data outputted from the analog type electric power system simulator 53, whereby setting of the electric power system can be easily changed. In addition initial condition setting of the analog type electric power system simulator 53 is given from the digital type electric power system simulator 51, whereby a desired test condition can also be quickly set.

As mentioned above in detail, according to the fifth invention, the analog type electric power system simulator 53 and the digital type electric power system simulator 51 which can perform real-time processing are connected with the A/D-D/A converter 56, thus phenomena of a large scale electric power system can be simulated by the digital type electric power system simulator 51 with simple setting. Further not only setting of the electric power system is easily changed but also phenomena of real machines and apparatuses which are difficult to analyze by a computer becomes analyzable with more preciseness, thus simulation of the large scale electric power system making the best use of both the advantages of the analog type electric power system simulator and the digital type electric power system simulator becomes feasible with more preciseness and in real time.

Figure 14:
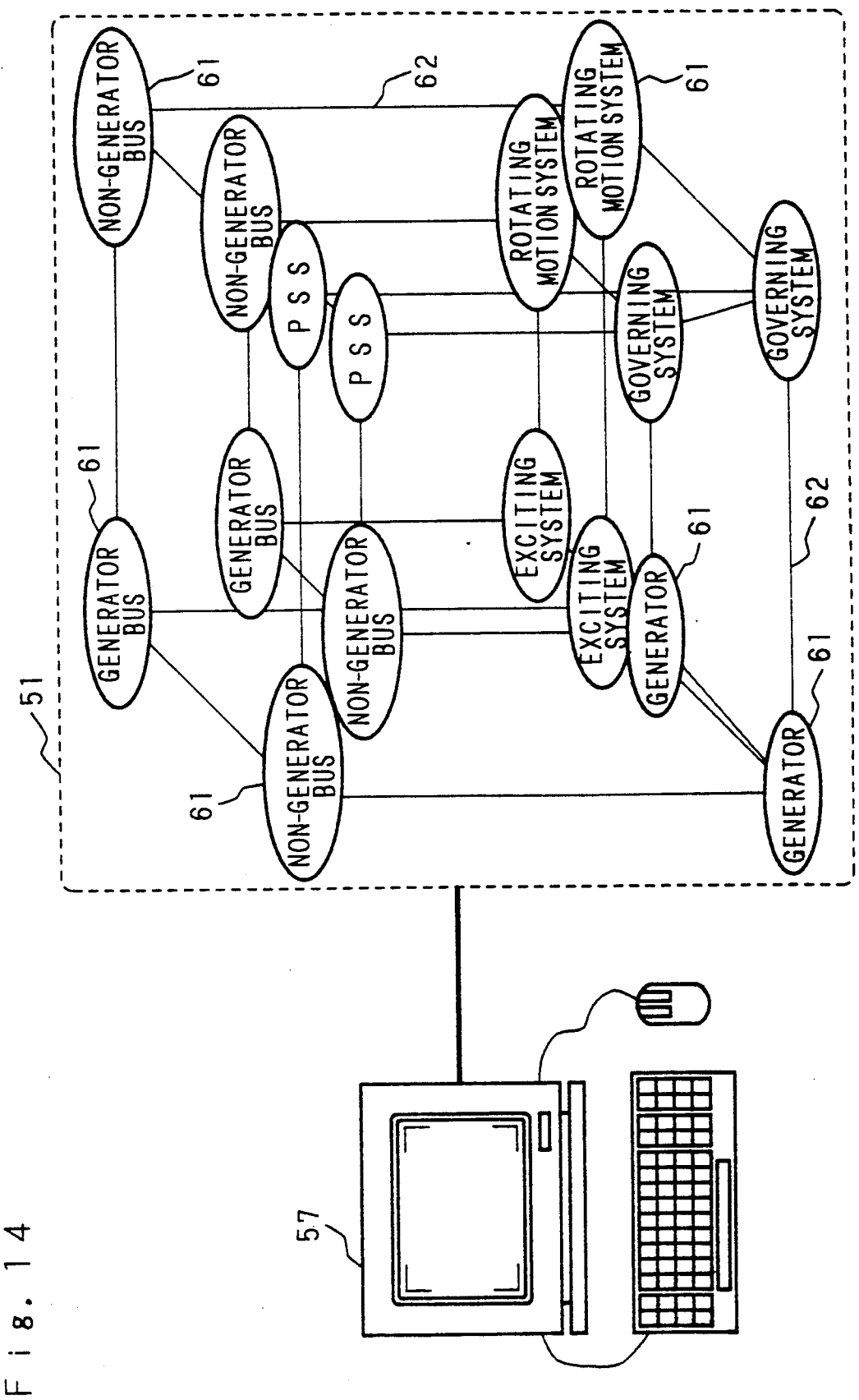
FIG. 14 is a schematic diagram showing a structure of the sixth invention of the electric power system simulator.
Figure 15:
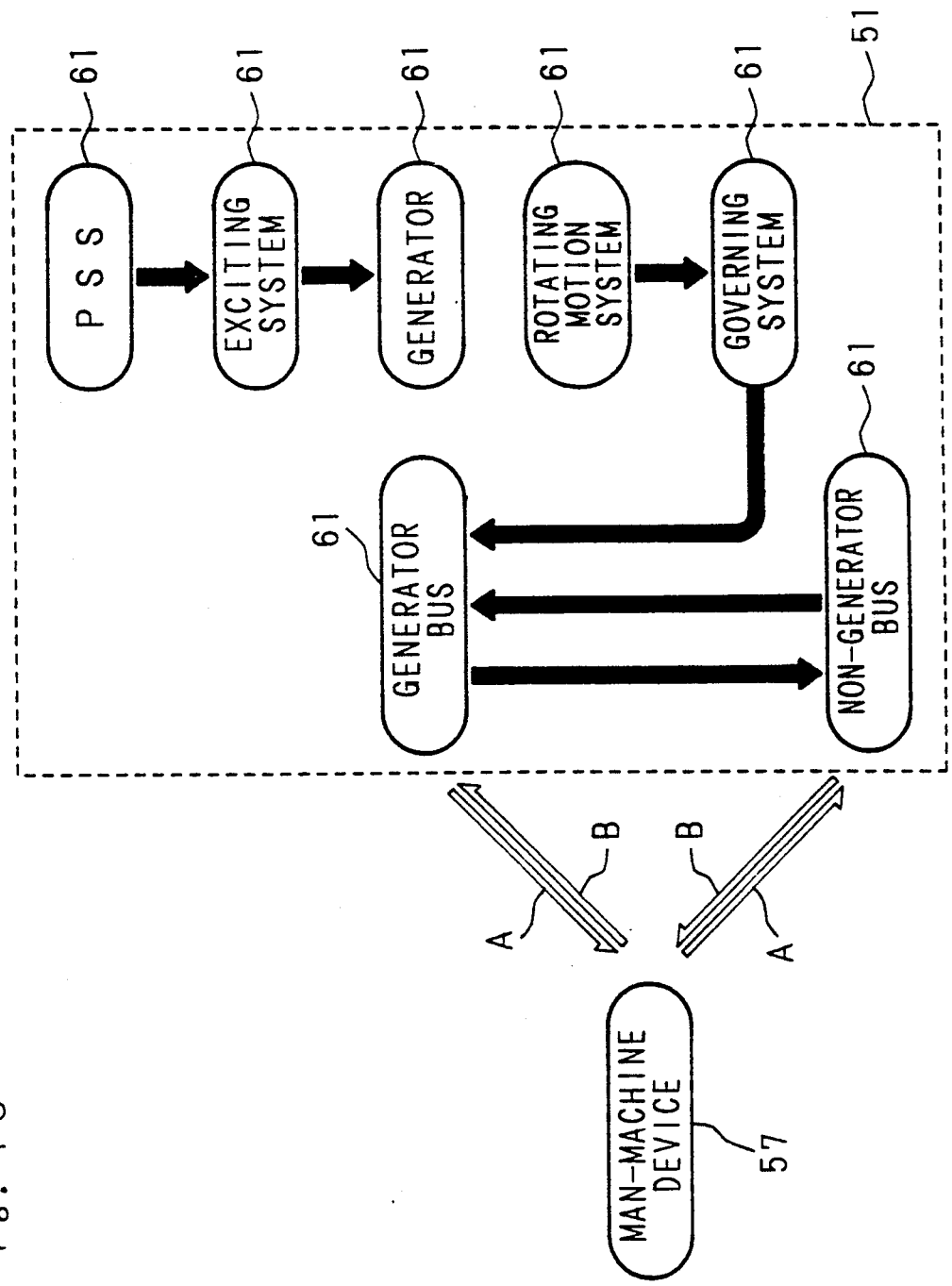
FIG. 15 is a functional block diagram of the electric power system simulator shown in FIG. 14.

FIG. 14 is a schematic diagram showing a configuration of the sixth invention of the electric power system simulator, and FIG. 15 is a functional block diagram of the simulator shown in FIG. 14.

In the sixth invention, a man-machine device 57 is connected to the electric power system simulator 51 which is the same as the digital type electric power system simulator utilizing the conventional decentralized type computer system shown in the FIG. 2.

In the sixth invention as aforementioned, results of decentralized-processed by the digital type electric power system simulator 51 are received by the man-machine device 57 and outputted therefrom with a technique which depends on human sensitivity such as meter indication or graphic display. Thus, by watching a man-machine device 57 screen, an operator can recognize a trouble as if it were arising just now with meter pointers deflecting and trouble data graphic displaying. Further, a condition change of each apparatus as a corrective action to a trouble during simulation can be directed from the man-machine device 57 as shown with an arrow B of FIG. 15, thus simulation of a trouble of the real electric power system can be performed with a real sense.

As mentioned above in detail, because the system of the sixth invention is provided with the man-machine device 57, interruption for a condition change is enabled at any timing, and condition of the electric power system during simulation is displayed with a real sense, and further a setting change of condition can be performed during simulation, thus operation like doing real troubleshooting becomes possible.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. An electric power system simulator comprising:
first calculating means for calculating a dynamic characteristic of a generator by cyclically obtaining an amplitude and a phase of internal induced voltage of said generator based on an output power and a terminal voltage of said generator;
second calculating means for calculating a dynamic characteristic of a load by obtaining an equivalent admittance of said load after simulation of the electric power system based on an amplitude of an A.C. voltage at an installation point of said load; and
third calculating means for calculating a power transmission condition of the electric power system network, indicative of fault or normal operation, by obtaining the output power and the terminal voltage of said generator by calculating an A.C. current flowing in each element of the electric power system with using the amplitude and the phase of said internal induced voltage of said generator obtained by said first calculating means, the equivalent admittance of said load obtained by said second calculating means and an impedance of the electric power system network;
wherein said condition change of the electric power system including said generator is serially simulated by alternately performing the calculations of said first and said second calculating means and the calculation of said third calculating means.

2. The electric power system simulator as set forth in claim 1, wherein the calculation of A.C. current by said third calculating means is performed by a system network calculation.

3. An electric power system simulator comprising:
first calculating means for calculating a dynamic characteristics of a generator;
second calculating means for calculating a power transmission condition of an entire electric power system network, indicative of fault or normal operation, for outputting an output power and a terminal voltage of said generator; and
communicating means for communicating between said first calculating means and said second calculating means by transferring information;
wherein said first calculating means cyclically calculates information on an internal induced voltage of said generator representative of condition of said generator based on the output power and the terminal voltage of said generator outputted from said second calculating means, and outputs said information to said second calculating means through said communicating means,
said second calculating means calculates power transmission condition of said electric power system network at predetermined time with using said information and various constants of said electric power system network, and
said condition change of the electric power system including said generator is serially simulated by alternately executing the calculation of said first calculating means and the calculation of said second calculating means.

4. An electric power system simulator as set forth in claim 3, wherein said second calculating means comprises a calculating unit which calculates the power transmission condition of said electric power system network, and a time management unit which makes said calculating unit calculate by indicating every cycle for calculation.

5. An electric power system simulator comprising:
first calculating means, having
phase calculating means for calculating a phase of internal induced voltage of a generator,
phase correcting means for correcting calculated phase value by said phase calculating means by subtracting from the calculated phase value by value of 360° multiplied by an integer or adding to the calculated phase value by value of 360° multiplied by an integer when an absolute value of the phase value calculated by said phase calculating means exceeds 360°, and
amplitude calculating means for calculating an amplitude of internal induced voltage of said generator, and for calculating a dynamic characteristic of a generator; and second calculating means for calculating a power transmission condition of an entire electric power system network, indicative of fault or normal operation;

wherein said first calculating means cyclically calculates an amplitude and the phase of internal induced voltage of said generator representative of condition of said generator based on the output power and the terminal voltage of said generator outputted from said second calculating means, and outputs an information of calculated result to said second calculating means, said second calculating means calculates power transmission condition of said electric power system network at predetermined time with using said information and various constants of said electric power system network, and said condition change of the electric power system including said generator is serially simulated by alternately executing the calculation of said first calculating means and the calculation of said second calculating means.

6. An electric power system simulator connected to an external data source comprising:

an analog type simulator which simulates a phenomenon of an electric power system by combining a plurality of simulation devices each of which simulates each element constituting electric power system;

a digital type simulator which calculates a phenomenon of the electric power system, based on data supplied from said external data source, at a speed same as or near the proceeding speed of the real phenomenon and simulates the phenomenon in real time; and an A/D-D/A converter which transfers data between said analog type simulator and said digital type simulator.

7. An electric power system simulator connected to an external data source comprising:

a digital type simulator which calculates a phenomenon of an electric power system based on data supplied from said external data source at a speed same as or near the proceeding speed of the real phenomenon and simulates the phenomenon in real time; and a man-machine device which displays information outputted from said digital type simulator and is able to perform interruption for a condition change to said digital type simulator in real time.

* * * * *

UNITED STATES PATENT AND TRADEMARK OFFICE
CERTIFICATE OF CORRECTION

PATENT NO. : 5,317,525
DATED : May 31, 1994
INVENTOR(S) : H. Taoka et al.

It is certified that error appears in the above-identified patent and that said Letters Patent is hereby corrected as shown below:

Col. 17, line 14 (Equation 4); "$(Y_G*V_G$" should be --$(\underline{Y_G}*\underline{V_G}$--.

Col. 17, line 34, "$Y_G*V_G$" should be --$\underline{Y_G}*\underline{V_G}$--.

Col. 20, line 20, "characteristics" should be --characteristic--.

Signed and Sealed this

Fourth Day of October, 1994

Attest:

BRUCE LEHMAN

*Attesting Officer*  *Commissioner of Patents and Trademarks*